US 6,775,813 B2

United States Patent
Chopra et al.

(10) Patent No.: US 6,775,813 B2
(45) Date of Patent: Aug. 10, 2004

(54) AGGREGATION OF STORAGE ELEMENTS INTO STATIONS AND PLACEMENT OF SAME INTO AN INTEGRATED CIRCUIT OR DESIGN

(75) Inventors: Sachin Chopra, Cupertino, CA (US); Yu-Yen Mo, San Jose, CA (US); Shyam Sundar, Sunnyvale, CA (US); Peter F. Lai, San Jose, CA (US); Kong-Fai Woo, San Jose, CA (US); Venkat Podduturi, San Jose, CA (US); Vishal Chopra, Cupertino, CA (US)

(73) Assignee: Sun Microsystems, Inc., Santa Clara, CA (US)

(*) Notice: Subject to any disclaimer, the term of this patent is extended or adjusted under 35 U.S.C. 154(b) by 0 days.

(21) Appl. No.: 10/238,357

(22) Filed: Sep. 10, 2002

(65) Prior Publication Data

US 2004/0049756 A1 Mar. 11, 2004

(51) Int. Cl.[7] ................................. G06F 9/45
(52) U.S. Cl. .................. 716/10; 716/8; 716/9
(58) Field of Search ................. 716/1, 2, 3, 4–11, 716/12–14; 326/46, 38

(56) References Cited

U.S. PATENT DOCUMENTS

| 6,347,393 | B1 | * | 2/2002 | Alpert et al. ................ 716/2 |
| 6,440,780 | B1 | * | 8/2002 | Kimura et al. ............. 438/129 |
| 6,518,788 | B2 | * | 2/2003 | Kasahara .................... 326/46 |
| 6,578,184 | B2 | * | 6/2003 | Fukuda et al. ............. 716/13 |
| 6,591,407 | B1 | * | 7/2003 | Kaufman et al. ........... 716/10 |

* cited by examiner

Primary Examiner—Vuthe Siek
Assistant Examiner—Binh Tat
(74) Attorney, Agent, or Firm—Zagorin, O'Brian & Graham LLP

(57) ABSTRACT

The present invention describes a method and apparatus for placing flops in a complex circuit design. Initially, the method calculates a physical range for every net that requires a flop, within which the flop can be placed satisfying the timing requirement. After the physical range is defined, the method groups these flops and determines a block where these grouped flops can be placed. Grouping these flops into one block (flop station) can preserve a compact layout for the design. The flops are then connected to appropriate nets.

14 Claims, 3 Drawing Sheets

AGGREGATION OF STORAGE ELEMENTS INTO STATIONS AND PLACEMENT OF SAME INTO AN INTEGRATED CIRCUIT OR DESIGN

BACKGROUND OF THE INVENTION

1. Field of the Invention

The invention relates generally to semiconductor integrated circuits as well as designs and design tools therefor and, more specifically, to techniques for placement of storage stations in into an integrated circuit or design.

2. Description of the Related Art

Timing-critical paths (or nets) of a semiconductor integrated circuit can affect delivery of signals in a way that limits achievable operating frequency. Indeed, one of the significant limiting factors in the design of modern, high-performance microprocessors is interconnect delay. Typically, interconnect delay, rather than logic delay limits operating frequency of circuits designed to operate in the gigahertz range.

A common design technique employed to overcome the limitations imposed by certain timing critical paths, including those that arise due to maxtime constraint violating interconnect delays, is to insert storage elements (e.g., flip-flops or flops), into the timing-critical paths. In effect, the insertion allows the otherwise critical path to retain a signal and deliver the signal in a subsequent clock cycle. In this way, a circuit path whose delay limited operating frequency can be replaced with a pair of half-paths that no longer violate timing constraints, thereby allowing a part or component circuit thereof to operate at higher frequency (assuming no other similarly limiting timing-critical paths).

Flop insertion is a conventional technique commonly employed, typically manually and iteratively, in designs for integrated circuits to improve operating frequency. One technique is to place individual flops into timing-critical paths at the particular point where, if there is an infinite drive buffer, then the buffer sees equal RC delay toward each driver and receiver in both directions.

Unfortunately, in complex integrated circuit designs, the number of timing-critical paths (or nets) can be quite large, numbering in the thousands or more, and placement rapidly becomes intractable, particularly when layout constraints are considered. Because the desired placement of a flop often conflicts with existing blocks of a design (e.g., devices, routing resources, etc.), either flop placements must be constrained by layout of existing blocks and resources or such layouts must be adapted to accommodate the desired placement. In either case, practical and computational requirements (including those associated with extended design and testing cycles) generally conflict with the goal of placing large numbers of flops into a design.

SUMMARY

What is needed is a technique that may be efficiently applied to place appropriate delay stages (e.g., flops or other delay stages) into large numbers (often thousands or more) of time-critical nets or circuit paths. Integrated circuit designs prepared or adapted using such techniques, as well as integrated circuits formed in accordance therewith and systems that incorporate such integrated circuits may exhibit improved performance or capabilities.

Accordingly, it has been discovered that by determining a suitable range of positions for introduction of a delay stage into time-critical nets and by aggregating, subsets of the desired delay stages into composite storage stations based, at least in part, on compatibility of respective suitable ranges, delay placement may be efficiently applied in very large integrated circuit designs. For example, in a test case, the problem of placing approximately 2000 flops into time-critical nets of a microprocessor design was reduced to placement of just 128 flop stations. Suitable positional ranges may be determined by performing timing analysis for each net that is routed through the flop station, in general, any of a variety of conventional or commercially available timing analysis tools or techniques may be employed to support such a determination.

Though placement of individual storage elements may be sub-optimal with respect to a given time-critical net, in general, the efficiency of placement can have both implementation-level and design-time benefits. For example, by localizing compatible storage elements in a composite storage station, more compact "by-N" layouts can generally be used rather than "by N−1" layouts. Smaller numbers of compact layouts can be efficiently evaluated for placement conflicts with other design blocks, blockage of routing resources, etc. In addition, the overall perturbation of a design (e.g., to accommodate or alleviate placement conflicts with other design blocks, blockage of routing resources, etc.) can be generally reduced with smaller numbers of composite, albeit larger, storage stations. Preferably, at least some of the composite storage stations may be placed, in whole or in part, in pre-existing free space. In this way, placement of storage elements can be exploited as a design technique in complex, high-speed semiconductor designs (e.g., gigahertz range microprocessors) at a scale generally unachievable using conventional techniques. In some realizations, determination of suitable placement ranges, grouping of desired storage elements into composite storage stations and placement of such storage stations in a semiconductor design may be partially or completely automated.

Some or all of the aforementioned benefits may be achieved in a given exploitation of the techniques described herein. Some, none or all of these benefits may appear in, or result from, any method, apparatus, article or system corresponding to any particular one of the appended claims.

In some embodiments in accordance with the present invention, a method for use in an integrated circuit design is described. The method includes identifying a range of suitable positions for insertion of a storage stage for timing-critical circuit paths, determining storage stations that each span a respective collection of the timing-critical circuit paths based at least in part on compatibility of the ranges of suitable position and introducing respective storage stages for the timing-critical circuit paths in the storage stations. In some variation, a substantial number of the timing-critical circuit paths spanned by a particular storage station exhibit generally uncorrelated timing requirements.

In some variation, the range of suitable positions are identified at least in part by identifying one or more positions on each one of the timing-critical circuit paths having substantially equal RC delay towards a first and a second ends of respective one of the timing-critical paths. In some variation, the one or more positions are identified at least in part by substantially using a predetermined generic timing model. In some embodiment, one or more of the storage stations are determined at least in part according to a predetermined storage station library. In some variation, the range of suitable positions comprises at least one continuous range of positions along respective timing-critical paths.

In some embodiment, the range of suitable positions includes multiple discrete positions along respective timing-critical paths. In some variation, the timing-critical paths require more than one clock cycle to transfer data. In some variation, the storage stations are determined substantially without rerouting the timing-critical paths spanned thereby. In some embodiment, the method includes merging the storage stations into one or more compact storage stations.

In some embodiment, a semiconductor integrated circuit is described in which storage elements are coupled into adjacent timing-critical circuit paths that, during operation, bear generally uncorrelated signals and in which the storage elements are grouped into composite storage stations that share at least some circuitry, wherein placement of at least a substantial number, more than half, of the individual storage elements of a composite storage station is suboptimal with respect to at least some of the respective timing-critical circuit paths.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

The description that follows focuses on techniques illustrative problem of inserting particular groupings of storage elements (e.g., flop stations) into an integrated circuit design. In that regard, much of the description focuses on design activities and processes typical of design tools. Nonetheless, the invention is not necessarily limited thereto. In particular, resultant articles including fabricating integrated circuits, design media embodiments of a particular design and tools, whether embodied as computer program products, apparatus or systems, are all contemplated and may fall within the scope of claims that follow. These and other embodiments will be appreciated based on the description that follows. In view of the above, and without limitation, exemplary design processes are now described.

The present application describes a method and apparatus for placing storage elements (e.g., flops, buffers or the like) in a complex circuit design. Initially, the method calculates a physical range for every net, requiring a flop, within which the flop can be placed satisfying the timing requirement for that net. After the physical ranges for each net are defined, the method identifies the overlapping ranges and groups these ranges into one block of storage elements (flop station). Grouping these ranges into one flop station can preserve a compact layout for the design. The nets are connected to appropriate storage elements in the flop stations.

Figure 1A:
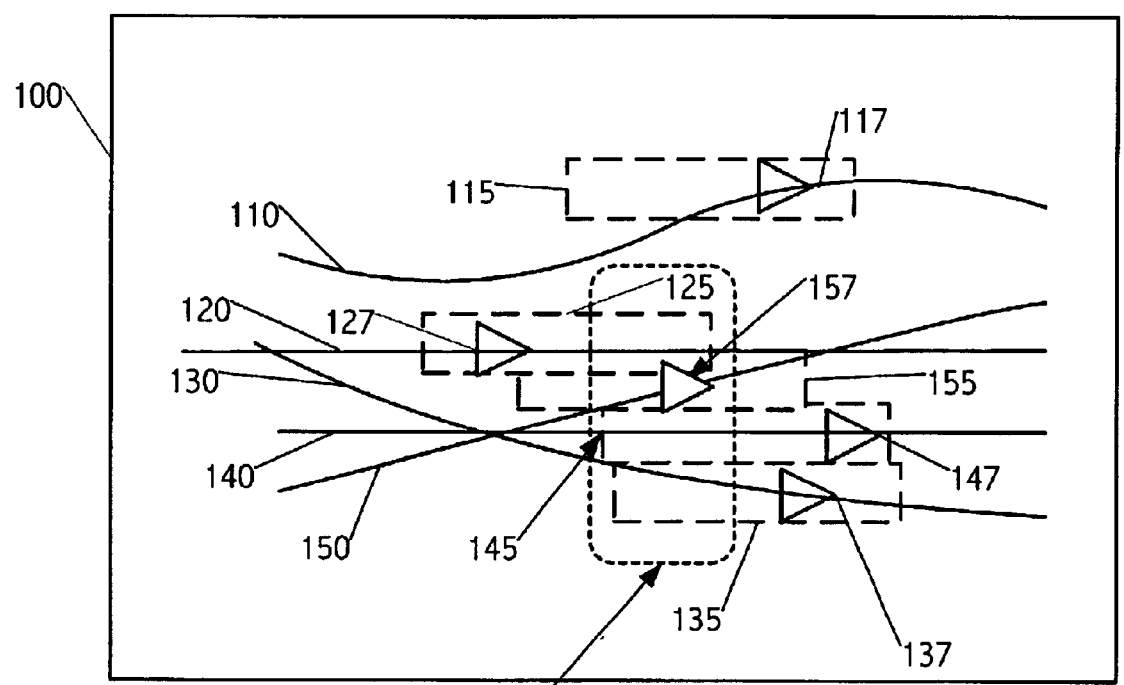
FIG. 1A illustrates a typical example of nets, storage elements in each net and ranges for storage elements in an integrated circuit.

FIG. 1A illustrates a typical example of nets, storage elements in each net and ranges for storage elements in an integrated circuit (IC) 100. For purposes of illustration, in the present example, IC 100 includes five nets, 110, 120, 130, 140 and 150.These nets can be part of different layers and different circuits in IC 100. Each one of these nets has signal delay longer than a clock cycle for IC 100 and thus require storage element therein. The characteristics (e.g., timing, noise, interference or the like) of a signal on a net can be determined using conventional simulation techniques. Once the characteristics of the signal have been determined, the circuit designer can identify an optimal physical location on the net to place a storage element to satisfy the signal requirements on the net. Generally, the storage element can be moved within a physical range on the net without affecting the effectiveness of the storage element. The storage element can be moved within the range for routing purposes.

In the present example, net 110 includes a range 115 within which a storage element 117 can be placed. Further, net 120 has a range 125 for a storage element 127, net 130 has a range 135 for a storage element 137, net 140 has a range 145 for a storage element 147 and net 150 has a range 155 for storage element 157. The ranges of each net, except net 110, overlap within an area marked as 160. Storage element 157 is within marked area 160 however storage elements 127, 147 and 157 are outside the marked area 160. Storage elements 127, 147 and 157 can be moved within marked area 160 without affecting their effectiveness because each storage element stays within its identified range on respective net.

Figure 1B:
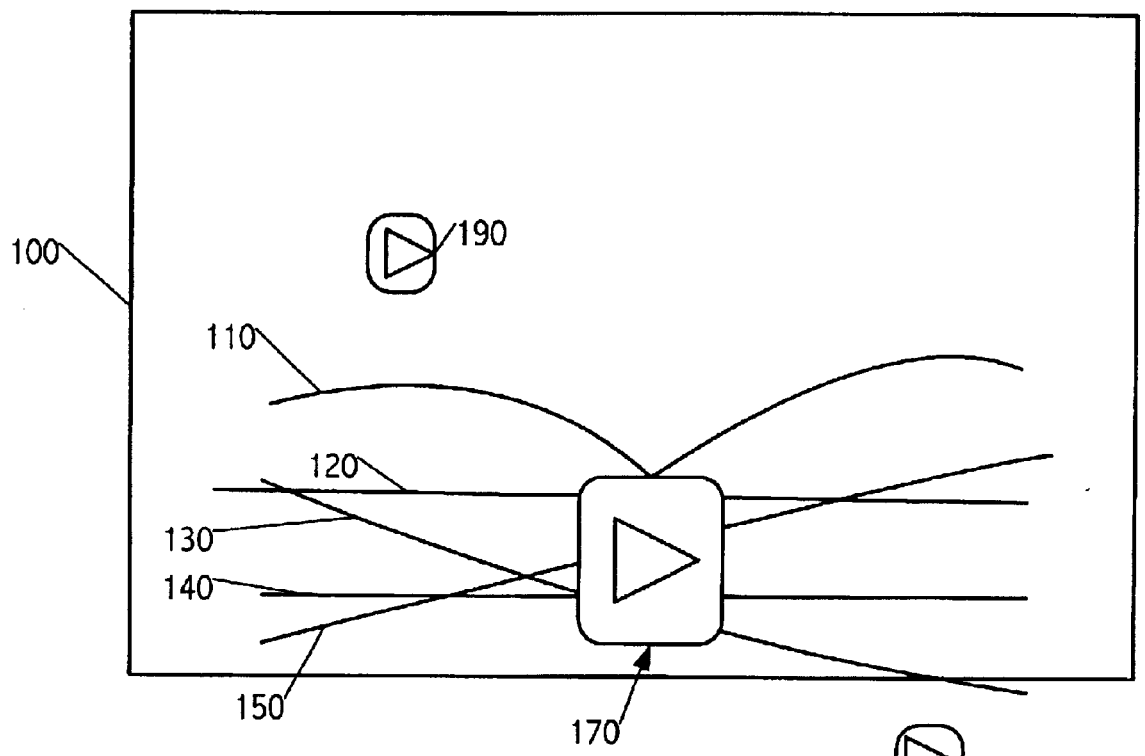
FIG. 1B is an example of combining various storage elements into one storage station according to an embodiment of the present invention.

FIG. 1B is an example of combining various storage elements into one storage station according to an embodiment of the present invention. A storage station 170 is placed in an area where various ranges of different nets overlap. The overlapping ranges of nets are grouped together into storage station 170. Storage station 170 includes storage elements that can be coupled to respective nets. Similarly, for purposes of illustrations, in the present example, two other storage stations, 180 and 190 are shown in IC 100. These storage stations are coupled to respective nets to provide a storage element station. In the present example, net 110 did not have an overlapping range of storage element 147 with other nets however net 110 is also coupled to storage station 170. To maximize the use of storage station 170, net 110 is re-routed to take advantage of storage station 170. One skilled in art will appreciate that the storage stations may not always be an optimal point for storage element placement for some nets however, if the signal integrity can be maintained, storage station 170 can be used for various nets to preserve a compact layout.

Figure 2:
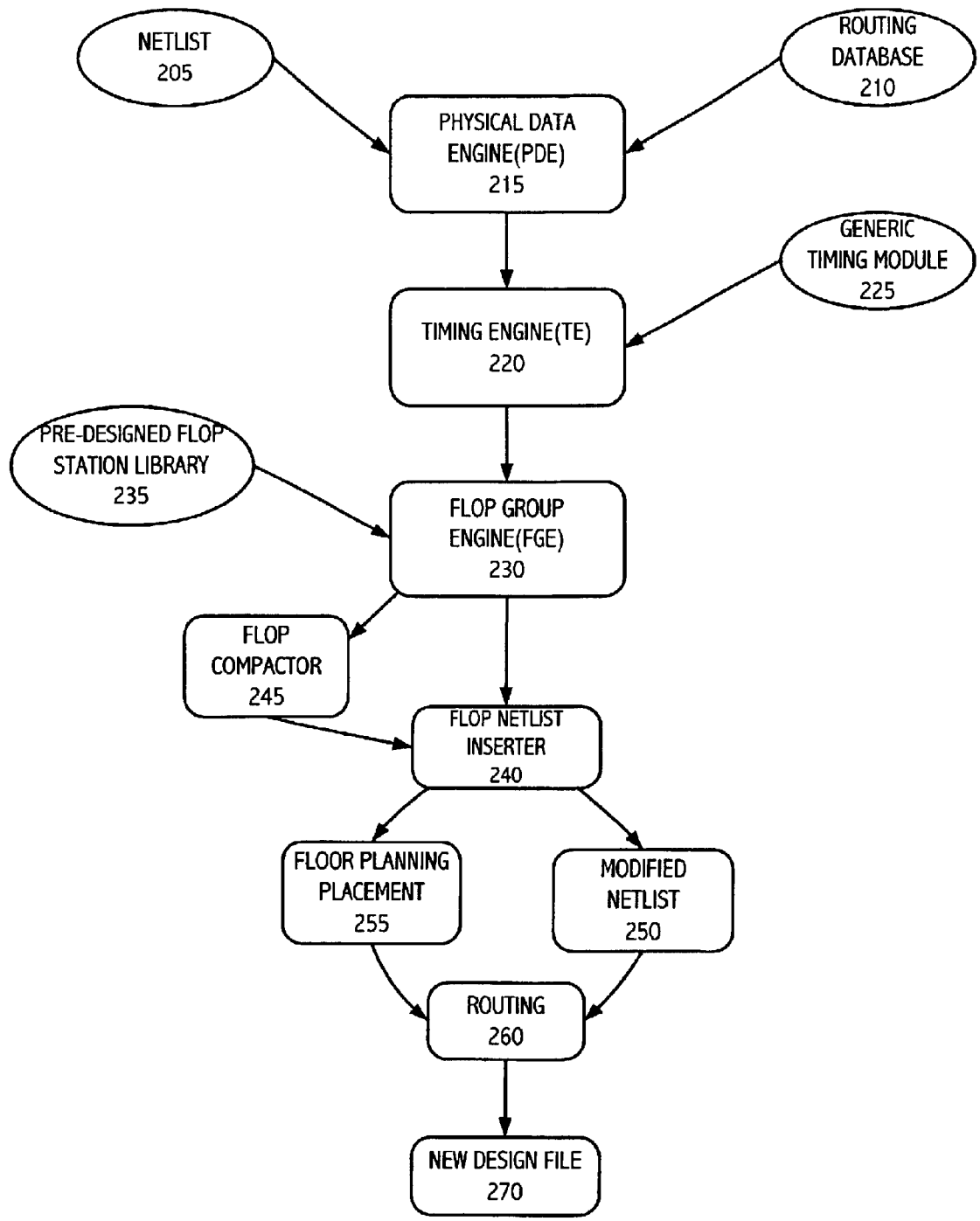
FIG. 2 illustrates an example of top-level process flow according to an embodiment of the present invention.

FIG. 2 illustrates an example of top-level process flow according to an embodiment of the present invention. While for purposes of illustrations, in the present example, certain communication links are shown between certain modules, one skilled in the art will appreciate that these processes can independently communicate with any other process shown in FIG. 2. Additionally, those skilled in the art will recognize that the boundaries between modules are merely illustrative and alternative embodiments may merge modules or impose an alternative decomposition of functionality of modules. For example, the modules discussed herein may be decomposed into submodules to be executed as multiple computer processes. Moreover, alternative embodiments may combine multiple instances of a particular module or submodule. Furthermore, those skilled in the art will recognize that the operations described in exemplary embodiment are for illustration only. Operations may be combined or the functionality of the operations may be distributed in additional operations in accordance with the invention.

Initially, when a circuit is designed using conventional design tools (e.g. VHDL, Verilog or the like), a netlist 205 and a routing database 210 are generated. The method of generating netlist 205 and routing database 210 are known in the art. Netlist 205 and routing database 210 are used by a physical data engine (PDE) 215. PDE 215 can be any conventional data analysis tool (e.g., IC-Craftsman or the like) that can analyze the data in netlist 205 and routing database 210 in combination to determine and compute the physical characteristics of each timing-critical path in the circuit (e.g., resistance, capacitance, coupling, inductance, cross-talk, characteristics of adjacent paths, noise and the like). PDE 215 analyses the circuit and produces actual physical data for the integrated circuit (e.g., metals used for routing, routing length/direction or the like). PDE 215 generates detailed physical design information for the integrated circuit.

A timing engine (TE) 220 receives the physical data generated by PDE 215. TE 220 performs complex timing analysis and generates timing related information for each path in the integrated circuit (e.g., clock period, frequency, cycle time constraints or the like). In general, any of a variety of conventional or commercially available timing analysis tools or techniques may be employed to support such a determination. Based on the timing analysis, TE 220 determines a range with minimum and maximum distance between each end of timing-critical nets within which a storage element can be inserted that can satisfy the timing requirements (e.g., clock period, frequency constraints or the like) for that particular net. TE 220 can optionally input a pre-determined generic timing model 225. Generic timing model 225 can be any base timing model determined based on the design architecture of the integrated circuit. For example, the base architecture design for the integrated circuit can specify certain timing limitations for different modules within the integrated circuit. Thus, the timing analyses of one of those modules may incorporate specified timing limitations to determine the timing requirements for each net within that module.

Once the ranges for storage elements on each net are determined by TE 220, a flop grouping engine (FGE) 230 identifies the overlapping ranges from the data provided by TE 220. Overlapping ranges can be identified by comparing the end points of each range. For purposes of illustration, in the present example, the ranges for each net can be compared against the overall architecture of the integrated circuit to identify concentration of overlapping ranges. In some variation, sub-blocks of the integrated circuit can be identified and the ranges for each net falling within the sub-block can be compared to identify the overlapping ranges. Similarly, various different techniques can be employed to identify the overlapping ranges of each timing-critical net.

FGE 230 groups each overlapping range into one block. While grouping the overlapping ranges for each timing-critical path, FGE 230 can optionally input data from a pre-designed flop station library 235. Pre-designed flop station library 235 can be a repository of any previous iterations of flop insertion process for the same base architecture of the integrated circuit. Pre-designed flop station library 235 can dictate an overall number of flop group stations (e.g., 16, 32, 48, 64 or the like) to FGE 230 based on the base architecture of the integrated circuit. When pre-designed flop station library 235 sets limits on the number of flop stations that can be defined, FGE 230 optimizes the number of groups of overlapping ranges (e.g., by merging adjacent ranges for paths or the like) within the design limits of the base architecture of the integrated circuit defined for each path.

FGE 230 identifies free space within the integrated circuit (e.g., using the physical data generated by PDE 215 or the like) where the groups of storage stations can be placed (e.g., similar to the process described in FIG. 1B or the like). Generally, the groups of storage stations are placed in a location in the integrated circuit where maximum number of critical nets can be routed without affecting the integrity of the signal. Each integrated circuit design can determine the percentage of critical nets that can be successfully placed in the storage station. For example, FGE 230 can identify a spot within the integrated circuit where the ranges (such as described in FIG. 1B) of a predetermined number (e.g., 70%, 80% or the like) of the critical nets overlap for a storage station. Similarly, various different parameters (e.g., proximity to certain sub-block, within certain design plane, physical location, or the like) can be defined for FGE 230 for storage station identification.

The output of FGE 230 can optionally be used by a flop compactor 240. If the underlying base architecture of the integrated circuit permits, flop compactor 245 identifies individual grouped storage stations that can be combined into a unified group of storage stations while maintaining the signal integrity for each net. Flop compactor 245 combines the storage stations into one or more storage stations thus reducing the number of storage stations within the integrated circuit. The output of FGE 230 is used by a flop netlist inserter 240. Flop netlist inserter 240 modifies original netlist 205 to include new flop stations and generates a modified netlist 250 and a floor planning and placement plot 255 for the integrated circuit. A routing process 260 uses floor planning and placement plot 255 and modified netlist 250 to generate new design file 270 for the integrated circuit. Routing processor 260 can be any conventional routing processor While for purposes of illustrations, in the present example, certain communication links are shown between certain processes, one skilled in the art will appreciate that these processes can independently communicate with any other process shown in FIG. 2. For example, FGE 230 identifies free space in the design using the physical data generated by PDE 215. Floor planning and placement plot 255 use PDE 215 data to plan integrated circuit floor plan. Similarly, Flop netlist inserter 245 modifies the original netlist 205 to generate modified netlist 250 and the like. Each process can be executed independent of the other and can interact and communicate information with every other process shown and described in FIG. 2.

Figure 3:
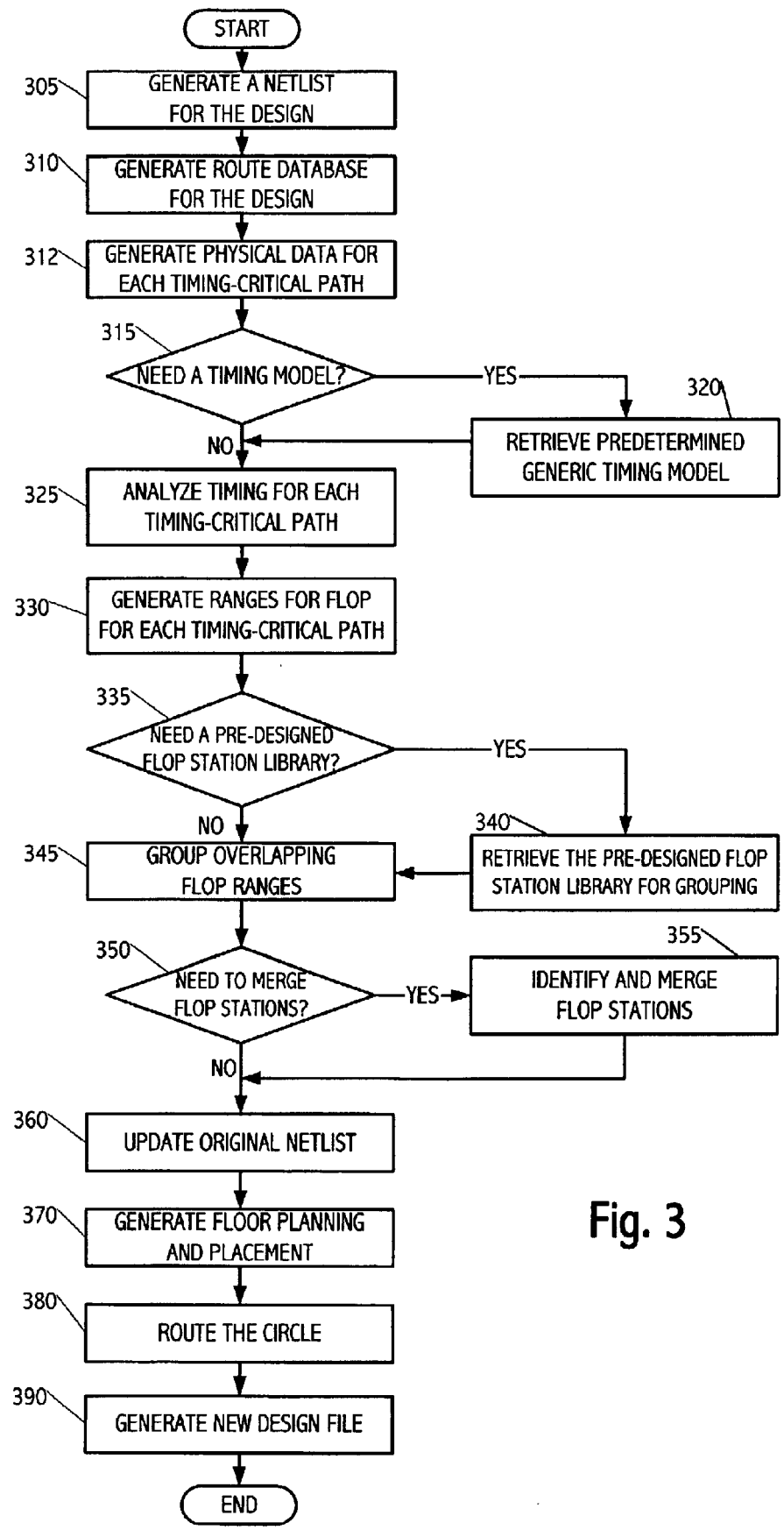
FIG. 3 is a flow diagram illustrating an exemplary sequence of operations performed during a process of inserting storage elements in a given integrated circuit design according to an embodiment of the present invention.

FIG. 3 is a flow diagram illustrating an exemplary sequence of operations performed during a process of inserting storage elements in a given integrated circuit design according to an embodiment of the present invention. While the operations are described in a particular order, the operations described herein can be performed in other sequential orders (or in parallel) as long as dependencies between operations allow. In general, a particular sequence of operations is a matter of design choice and a variety of sequences can be appreciated by persons of skill in the art based on the description herein.

Initially, the process generates a netlist for the design (305). The process generates a routing database for the design (310). The methods of generating the netlist and the routing database are known in the art. The process computes and generates the physical data for each timing-critical path in the design (312). The physical data can include physical characteristics of each timing-critical path in the circuit (e.g., resistance, capacitance, coupling, inductance, cross-talk, characteristics of adjacent paths, noise and the like). The physical data can be computed by a physical data engine (e.g., PDE 115 or the like) by using the information in the netlist and the routing database.

The process determines whether a predetermined timing model is required for the timing analysis of timing-critical nets of the design (315). A timing model for a block of the integrated circuit can be predetermined for the base architecture of the integrated circuit. If a predetermined generic timing model is needed for the block, the process retrieves a predetermined block timing model from a library (320). Generic timing model can be any base timing model that is predetermined based on the design architecture of the integrated circuit. The process proceeds to analyze the timings for the nets (325). If predetermined timing model for the block is not needed, the process analyses timings for identified timing-critical nets in the block individually to determine the need for storage elements for each timing-critical net (325).

The process generates the ranges of physical distance for each timing-critical net within which a storage element can be inserted (330). The process determines whether a predetermined flop station library is needed for the grouping (335). The predetermined flop station library can be a repository that includes storage stations for the design that may have been identified in any previous iteration of flop insertion process for the base architecture. The pre-designed flop station library can also define any predetermined number of storage stations required by the base architecture of the integrated circuit (e.g., 16, 32, 48, 64 or the like). If a pre-designed flop station library is required, process retrieves the grouping requirements from the pre-designed flop station library (340). The process then proceeds to group overlapping ranges (345).

If the pre-designed flop station library is not required, the process groups the overlapping ranges into storage stations (345). The process determines whether the grouped storage stations can be merged (350). The grouped storage station can be merged to optimize the space use and simplify the routing for the integrated circuit. If the storage stations require merging, the process identifies the storage stations that can be merged (e.g., adjacent stations or the like) and merges the identified storage stations (355). The process proceeds to update the original netlist (360).

If the storage stations do not require merging, the process updates the original netlist to include storage elements in the timing-critical nets (360). The process generates the floor planning and placement plots for the integrated circuit (370). The process generates modified routing for the integrated circuit (380). The process generates the new design file (390). One skilled in art will appreciate that while for purposes of illustration, certain steps are presented sequentially, these steps can be performed in other sequential orders (or in parallel) as long as dependencies between operations allow.

The above description is intended to describe at least one embodiment of the invention. The above description is not intended to define the scope of the invention. Rather, the scope of the invention is defined in the claims below. Thus, other embodiments of the invention include other variations, modifications, additions, and/or improvements to the above description. For example, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

The above described method, the operations thereof and modules therefor may be executed on a computer system configured to execute the operations of the method and/or may be executed from computer-readable media. Computer systems may be found in many forms including but not limited to mainframes, minicomputers, servers, workstations, personal computers, notepads, personal digital assistants, various wireless devices and embedded systems, just to name a few. A typical computer system includes at least one processing unit, associated memory and a number of input/output (I/O) devices. A computer system processes information according to a program and produces resultant output information via I/O devices. A program is a list of instructions such as a particular application program and/or an operating system. A computer program is typically stored internally on computer readable storage media or transmitted to the computer system via a computer readable transmission medium. A computer process typically includes an executing (running) program or portion of a program, current program values and state information, and the resources used by the operating system to manage the execution of the process. A parent computer process may spawn other, child processes to help perform the overall functionality of the parent process. Because the parent process specifically spawns the child processes to perform a portion of the overall functionality of the parent process, the functions performed by child processes (and grandchild processes, etc.) may sometimes be described as being performed by the parent process.

The method described above may be embodied in a computer-readable medium for configuring a computer system to execute the method. The computer readable media may be permanently, removably or remotely coupled to system 100 or another system. The computer readable media may include, for example and without limitation, any number of the following: magnetic storage media including disk and tape storage media; optical storage media such as compact disk media (e.g., CD-ROM, CD-R, etc.) and digital video disk storage media; holographic memory; nonvolatile memory storage media including semiconductor-based memory units such as FLASH memory, EEPROM, EPROM, ROM; ferromagnetic digital memories; volatile storage media including registers, buffers or caches, main memory, RAM, etc.; and data transmission media including permanent and intermittent computer networks, point-to-point telecommunication equipment, carrier wave transmission media, the Internet, just to name a few. Other new and various types of computer-readable media may be used to store and/or transmit the software modules discussed herein.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims.

What is claimed is:

1. A method for use in an integrated circuit design, the method comprising:

identifying for each of a plurality of timing-critical circuit paths, a range of suitable positions for insertion of a storage stage therein;

determining, based at least in part on compatibility of said ranges of suitable position, storage stations that each span a respective collection of said plurality of timing-critical circuit paths and introducing respective storeage stages for said plurality of timing-critical circuit paths in said storage stations.

2. The method of claim 1, wherein a substantial number of said timing-critical circuit paths spanned by a particular storage station exhibit generally uncorrelated timing requirements.

3. The method of claim 1, wherein said range of suitable positions are identified at least in part by identifying one or more positions on each one of said plurality of timing-critical circuit paths having substantially equal RC delay towards a first and a second ends of respective one of said plurality of timing-critical paths.

4. The method of claim 3, wherein said one or more positions are identified at least in part by substantially using a predetermined generic timing model.

5. The method of claim 1, wherein one or more of said storage stations are determined at least in part according to a predetermined storage station library.

6. The method of claim 1, wherein said range of suitable positions comprises at least one continuous range of positions along respective timing-critical paths.

7. The method of claim 1, wherein said range of suitable positions comprises a plurality of discrete positions along respective timing-critical paths.

8. The method of claim 1, wherein said timing-critical paths require more than one clock cycle to transfer data.

9. The method of claim 1, wherein said storage stations are determined substantially without rerouting said timing-critical paths spanned thereby.

10. The method of claim 1, further comprising: merging said storage stations into one or more compact storage stations.

11. A method for making a computer readable media product that corresponds to a semiconductor integrated circuit design, the method comprising:

identifying for each of a plurality of timing-critical circuit paths, a range of suitable positions for insertion of a storage stage therein;

determining, based at least in part on compatibility of said ranges of suitable position, storage stations that each span a respective collection of said plurality of timing-critical circuit paths;

introducing respective storage stages for said plurality of timing-critical paths in said storage stations, wherein a substantial number of said timing-critical circuit paths spanned by a particular storage station exhibit generally uncorrelated timing requirements; and encoding in said computer readable media product, design features corresponding to the storage stations.

12. The method of claim 11, wherein said computer readable media product is embodied as one or more of a disk, tape or other magnetic, optical, semiconductor or electronic storage medium and a network, wireline, wireless or other communication medium.

13. A method for making a semiconductor integrated circuit product, the method comprising:

identifying for each of a plurality of timing-critical circuit paths of a design corresponding to said semiconductor integrated circuit, a range of positions therealong suitable for insertion of a storage stage;

determining, based at least in part on compatibility of respective ranges, storage stations that each span a collection said plurality of timing-critical circuit paths and introduce respective storage stages thereinto, wherein at least a substantial number of said timing-critical circuit paths spanned by a particular storage station exhibit generally uncorrelated timing requirements;

forming at least said timing-critical circuit paths and storage stations of said semiconductor integrated circuit product.

14. The method of claim 13, wherein said semiconductor integrated circuit product is embodied as one or more of a disk, tape or other magnetic, optical, semiconductor or electronic storage medium and a network, wireline, wireless or other communication medium.

* * * * *

UNITED STATES PATENT AND TRADEMARK OFFICE
CERTIFICATE OF CORRECTION

PATENT NO. : 6,775,813 B2
DATED : August 10, 2004
INVENTOR(S) : Chopra et al.

It is certified that error appears in the above-identified patent and that said Letters Patent is hereby corrected as shown below:

Column 9,
Line 10, following "paths" insert -- ; --.
Line 11, delete "storeage" and replace with -- storage --.

Signed and Sealed this

First Day of March, 2005

JON W. DUDAS
*Director of the United States Patent and Trademark Office*